(12) United States Patent
Asada et al.

(10) Patent No.: US 6,589,802 B1
(45) Date of Patent: Jul. 8, 2003

(54) PACKAGING STRUCTURE AND METHOD OF PACKAGING ELECTRONIC PARTS

(75) Inventors: Toyoki Asada, Yokohama (JP); Yuji Fujita, Yokohama (JP); Kie Ueda, Yokohama (JP); Naoya Kanda, Fujisawa (JP); Mari Matsuyoshi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 322 days.

(21) Appl. No.: 09/640,647

(22) Filed: Aug. 18, 2000

(30) Foreign Application Priority Data

Dec. 24, 1999 (JP) .......................................... 11-366227

(51) Int. Cl.[7] .............................................. H01L 21/44
(52) U.S. Cl. ........................... 438/15; 438/17; 438/108; 438/118; 257/685; 257/687; 257/783; 257/778
(58) Field of Search .......................... 438/14, 15, 17, 438/4, 10, 108, 118, 119; 257/685, 687, 782, 783, 778

(56) References Cited

U.S. PATENT DOCUMENTS

| 4,784,872 | A | * | 11/1988 | Moeller et al. ............... 438/118 |
| 5,498,575 | A | * | 3/1996 | Onishi et al. ................. 438/125 |
| 5,930,597 | A | * | 7/1999 | Call et al. .................... 438/106 |
| 6,245,582 | B1 | * | 6/2001 | Yamaguchi et al. ........... 438/12 |
| 6,274,389 | B1 | * | 8/2001 | Iida et al. .................... 438/118 |
| 6,306,688 | B1 | * | 10/2001 | Lunceford .................... 438/15 |

FOREIGN PATENT DOCUMENTS

JP 09-221650 * 8/1997

* cited by examiner

*Primary Examiner*—Kevin M. Picardat
(74) *Attorney, Agent, or Firm*—Antonelli, Terry, Stout & Kraus, LLP

(57) ABSTRACT

The present invention a structure in which a semiconductor integrated circuit chip can be easily removed and the reliability of flip-chip bonding is assured, a method of packaging electronic parts, and method and apparatus for detaching electronic parts. According to the invention, the object is achieved by a flip-chip bonding structure using two kinds of soluble and insoluble resins for bonding a semiconductor integrated circuit chip and a circuit board.

6 Claims, 14 Drawing Sheets

TEST
(STEP A6)

PERMEATION
OF SOLVENT
(STEP A7)

HEATING
(STEP A8)

CHIP REMOVING DEVICE

REMOVAL OF CHIP (HEATING) (STEP A9)

REMOVAL OF CHIP (STEP A10)

COMPLETION OF
ATTACHMENT OF
ADHESIVE TAPE
(STEP C3)

CHIP REMOVING
DEVICE
(STEP C4)

PERMEATION OF SOLVENT

TEST
(STEP E6)

APPLICATION OF
INSOLUBLE RESIN
(STEP F1)

AFTER APPLICATION
OF INSOLUBLE RESIN
(STEP F2)
(TOP VIEW OF CHIP)

PACKAGING STRUCTURE AND METHOD OF PACKAGING ELECTRONIC PARTS

BACKGROUND OF THE INVENTION

1. Field of the Invention

The present invention relates to a packaging structure for bonding electronic parts to a circuit board and a method of packaging electronic parts.

2. Prior Art

Although soldering is often used for assembling a conventional electronic device, in order to satisfy demands of a smaller and thinner electronic device of higher packing density, the terminal pitch is becoming smaller and smaller due to an increase in the number of connection terminals and reduction in size of a package. With the conventional soldering technique, it is getting difficult to supply a solder to a fine electrode with high accuracy and is accordingly getting difficult to assemble an electronic device by soldering.

Bonding techniques for mounting a semiconductor integrated circuit chip onto a circuit board have been developed. Among them, flip-chip bonding for mounting a semiconductor integrated circuit chip with its active device face facing down to a circuit board is an effective method as means for realizing improvement in electric characteristics and packing density.

In the flip chip bonding, however, a semiconductor integrated circuit chip and a circuit board are bonded by using a resin. Consequently, once the semiconductor integrated circuit chip is mounted on the circuit board, it is difficult to detach the semiconductor integrated circuit chip from the circuit board. When a semiconductor integrated circuit chip is defective or a poor connection occurs, electronic devices and electronic parts on the whole circuit board are discarded. The yield is therefore low.

As a method of increasing the yield, a technique of easily detaching and replacing a semiconductor integrated circuit chip is necessary.

One of conventional methods of detaching a semiconductor integrated circuit chip is disclosed in Japanese Unexamined Patent Publication No. H8-186149. According to the method, only projected electrodes on a semiconductor integrated circuit chip and electrodes on a circuit board are bonded to each other. The semiconductor integrated circuit chip is subjected to an operation check. When it fails, the projected electrodes are irradiated with a laser beam from a side of the semiconductor integrated circuit chip so as to be cut, thereby detaching the semiconductor integrated circuit chip.

In the method of cutting the projected electrodes by irradiating the projected electrodes on the semiconductor integrated circuit chip with a laser beam, a laser beam is emitted in the horizontal direction with respect to the circuit board. In a state where parts are mounted around the semiconductor integrated circuit chip, it is therefore difficult to emit a laser beam toward the projected electrodes on the semiconductor integrated circuit chip. Generally, at the time of an operation check of a semiconductor integrated circuit chip or an electronic device, the semiconductor integrated circuit chip is not evaluated alone but is evaluated in a state where not only the semiconductor integrated circuit chip but also a bypass capacitor, a resistor and the like are mounted. Electronic parts are thus mounted around the semiconductor integrated chip.

Since the height of each projected electrode on the semiconductor integrated circuit chip is as low as tens to hundreds microns, the laser beam has to be irradiated with high accuracy, so that the work is difficult. There is consequently a problem such that a work cost of detaching the semiconductor integrated circuit chip is high.

SUMMARY OF THE INVENTION

In order to solve the problems of the conventional technique, it is an object of the present invention to provide a structure in which a semiconductor integrated circuit chip is easily detached and reliability of flip-chip bonding is assured, and to provide a method of mounting electronic devices.

According to the invention, in order to achieve the object, a flip-chip bonding structure using two kinds of resins of soluble and insoluble resins which are used to bond a semiconductor integrated circuit chip and a circuit board. The semiconductor integrated circuit chip is detached by dissolving the soluble resin with a solvent.

More specifically, the invention is defined in the claims.

A "soluble" resin has a two-dimensional molecular structure and an "insoluble" resin has a three-dimensional molecular structure. When an energy such as thermal energy or light energy is applied from the outside to a resin of the two-dimensional molecular structure, the resin is mixed with the substance of a solvent and is dispersed in a molecular state (dissolved). Consequently, the adhesion of the resin is weakened. Since the intermolecular force of the three-dimensional molecular structure is strong, the molecules are not easily dispersed (not dissolved).

As an example, packaging or repair as described hereinbelow is performed.

First, a soluble resin is applied in advance in the central part of a position in which a semiconductor integrated circuit chip will be mounted on a circuit board. After the projected electrodes on the semiconductor integrated circuit chip and electrodes on the substrate are positioned, the semiconductor integrated circuit chip is mounted on the circuit board, the semiconductor integrated circuit chip and the circuit board are heated by a bonding tool which attracts the semiconductor integrated circuit chip and a substrate stage on which the circuit board is placed, to thereby set the soluble resin.

Then parts to be soldered other than the semiconductor integrated circuit chip are mounted.

An operation check of the semiconductor integrated circuit chip and each of the parts mounted on the circuit board is performed.

When the semiconductor integrated circuit chip or a part mounted on the circuit board is faulty as a result of the test, the semiconductor integrated circuit chip is covered with cloth, and a solvent is applied on the cloth so as to permeate through and dissolve the soluble resin interposed between the semiconductor integrated circuit chip and the circuit board.

The "dissolution" denotes here a phenomenon that a substance which is inherently in a solid state is mixed with a substance in a liquid state and is dispersed in a molecule state or substances in a liquid state are mixed with each other. A phenomenon such that the adhesion is weakened by using a solvent is sufficient.

The bonding tool to which an adhesive is adhered is pressed against the semiconductor integrated circuit chip so that the adhesive is adhered to the semiconductor integrated circuit chip. When the bonding tool is lifted up, the semiconductor integrated circuit chip is detached from the circuit board.

Subsequently, the soluble resin is applied, a new semiconductor integrated circuit chip is mounted on the circuit board, and an operation check is made.

On the other hand, when the semiconductor integrated circuit chip or a part mounted on the circuit board passes the test, an insoluble resin is applied around the semiconductor integrated circuit chip and is set, thereby forming a fillet around the semiconductor integrated circuit chip. By applying the insoluble resin around the semiconductor integrated circuit chip, the resistance to the solvent can be improved.

With the construction, therefore, by using both the soluble resin and the insoluble resin, the very reliable packaging structure which is easily repaired can be provided.

DETAILED DESCRIPTION OF THE INVENTION

The present invention will now be described hereinbelow with reference to the drawings.

Figure 1:
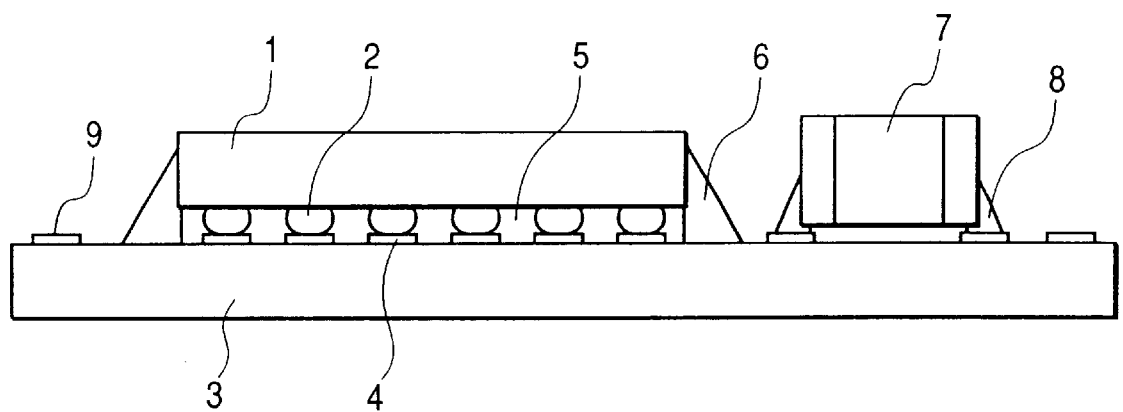
FIG. 1 is a cross section of a bonding structure in an embodiment of the invention.
Figure 2:
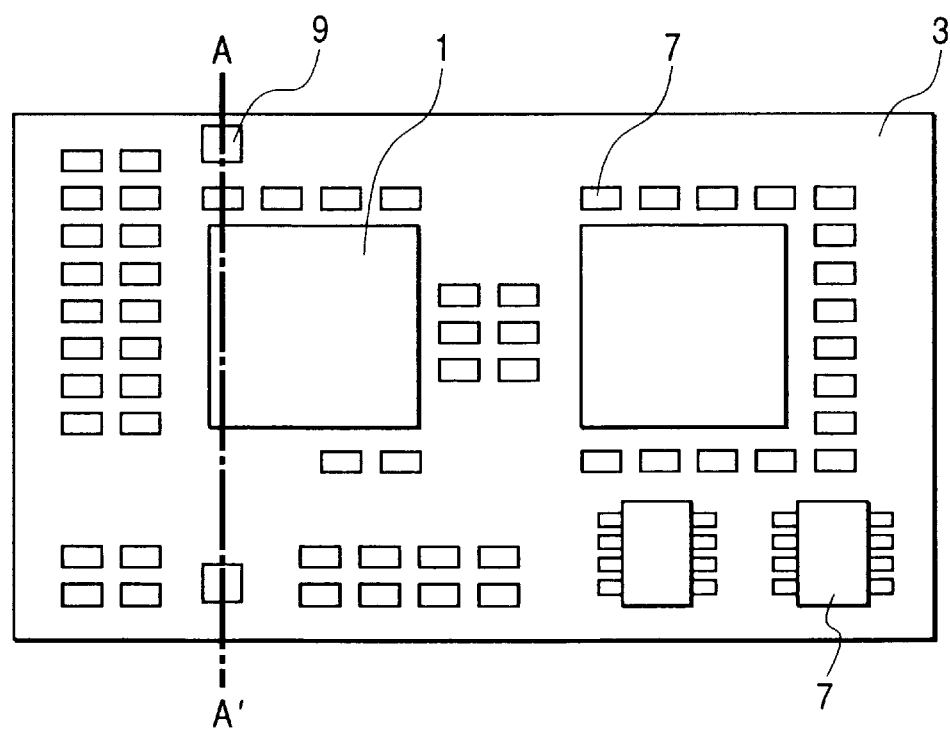
FIG. 2 is a diagram showing the whole bonding structure in the embodiment of the invention.

FIG. 1 is a cross section of a flip-chip bonding structure of the invention in which a semiconductor integrated circuit chip 1 has been bonded onto a circuit board 3. FIG. 2 shows the entire structure. Shown in FIG. 1 are the semiconductor integrated circuit chip 1, projected electrodes 2 on the semiconductor integrated circuit chip, the circuit board 3, substrate electrodes 4, a soluble resin 5 and an insoluble resin 6. The material of the projected electrodes 2 is, preferably, gold or solder. The soluble resin 5 is, preferably, acrylic resin, cyanoacrylate, polyethylene, polypropylene, ABS, or the like. The insoluble resin 6 is, preferably, epoxy resin, phenolic resin, or melamine resin.

Figure 3:
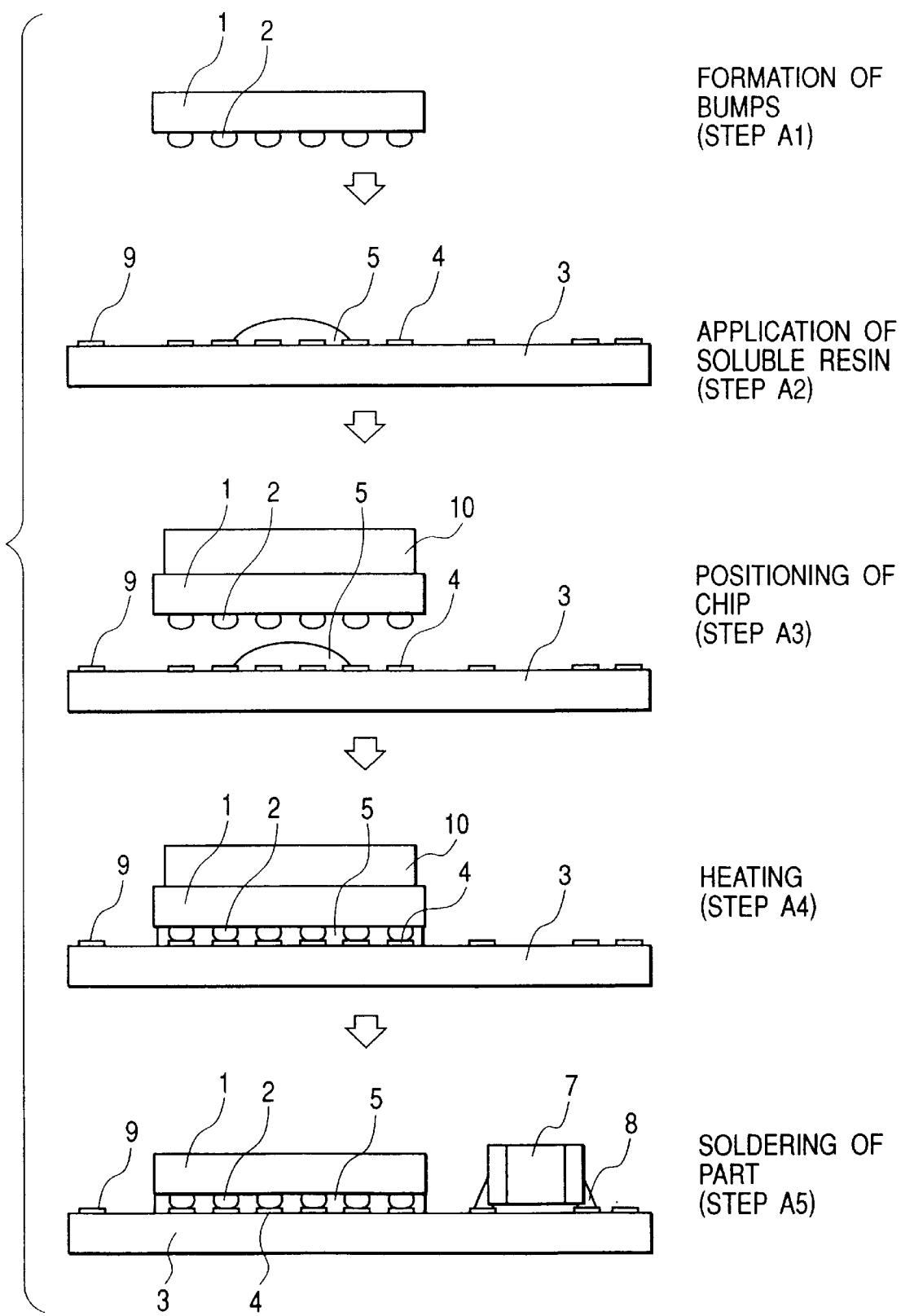
FIG. 3 is a diagram showing a process of mounting a chip in the embodiment of the invention.
Figure 4:
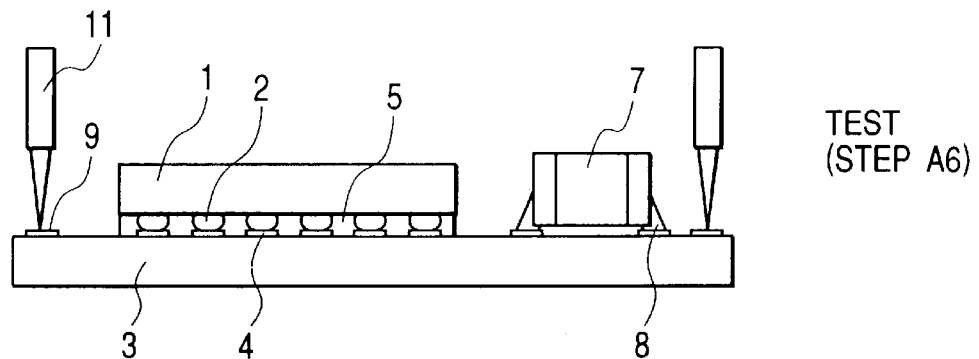
FIG. 4 is a diagram showing a process of mounting a chip in the embodiment of the invention.

Referring now to FIGS. 3 and 4, a method of mounting the semiconductor integrated circuit chip 1 having the projected electrodes 2 onto the circuit board 3 will be described.

As a pre-process of mounting the semiconductor integrated circuit chip 1 onto the circuit board 3, the projected electrodes 2 are formed on the semiconductor integrated circuit chip 1. When the projected electrodes 2 are made of gold, it is preferable to use wire bumping or plating to form the projected electrodes 2. In the case where the projected electrodes 2 are made of a solder, it is preferable to use plating, deposition, printing, or bonding of solder balls (step A1).

Subsequently, the soluble resin 5 is preliminarily applied to a position on the circuit board 3 on which the semiconductor integrated circuit chip 1 is to be mounted. Preferably, the soluble resin 5 is applied of an amount sufficiently interposed between the semiconductor integrated circuit chip 1 and the circuit board 3. In order to assure the reliability, at least an amount of the soluble resin 5 such that the outermost electrodes are covered with the soluble resin 5 is preferred (step A2).

The semiconductor integrated circuit chip 1 is attracted by a bonding tool 10 and the substrate electrodes 4 on the circuit board 3 and the projected electrodes 2 on the semiconductor integrated circuit chip 1 are positioned so as to be directly bonded with the active device face of the semiconductor integrated circuit chip 1 facing downward to the circuit board 3 (step A3).

The semiconductor integrated circuit chip 1 is mounted on the circuit board 3, and the semiconductor integrated circuit chip 1 is heated by the bonding tool 10 attracting the semiconductor integrated circuit chip 1 to thereby set the soluble resin 5. When the soluble resin 5 is a thermosetting resin, heat is applied. When the soluble resin 5 is a photosetting resin, light is applied. The soluble resin 5 may be heated either on or after mounting of the semiconductor integrated circuit chip 1 (step A4).

A part 7 to be soldered necessary for the operation check of the semiconductor integrated circuit chip 1 is mounted by a general method of printing of a solder 8, mounting the part and performing a reflow. The part 7 to be soldered may be mounded before the semiconductor integrated circuit chip 1 is mounted (before step A2) (step A5).

After the semiconductor integrated circuit chip 1 and the soldered part 7 are mounted, the semiconductor integrated circuit chip 1 or the part mounted on the circuit board 3 is tested. The test is conducted by, for example, making a probe 11 contact with an electrode 9 for test on the circuit board 3 and examining an output characteristic of the semiconductor integrated circuit chip 1 (step A6).

When the result of the test is that the semiconductor integrated circuit chip 1 is faulty, if the semiconductor integrated circuit chip 1 cannot be removed from the circuit board 3, the other soldered parts 7 mounted on the circuit board 3 have to be also discarded, so that it deteriorates the yield. Further, since it is difficult to test the semiconductor integrated circuit chip 1 alone, the possibility that a defective part is included is high. In the case where a plurality of semiconductor integrated circuit chips 1 are mounted on the circuit board 3, the possibility that a mass of defective parts are manufactured is high. In order to solve the problem, therefore, a method of removing the semiconductor integrated circuit chip 1 from the circuit board 3 is necessary.

FIGS. 5 to 8 show an example of a method of removing the semiconductor integrated circuit chip 1 from the circuit board 3.

Figure 5:
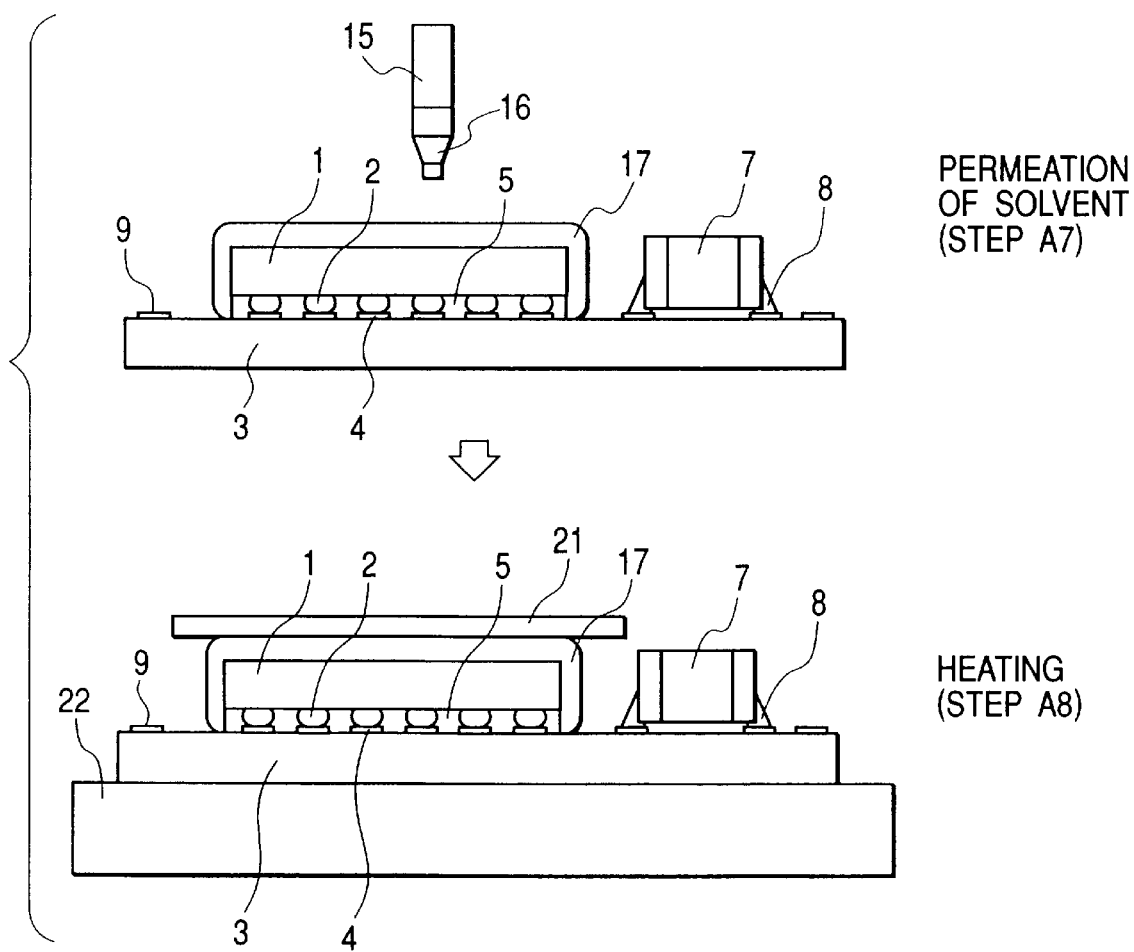
FIG. 5 is a diagram showing a solvent permeating process in the embodiment of the invention.

As shown in FIG. 5, the semiconductor integrated circuit chip 1 is covered with cloth 17 and a solvent 16 is applied by a dispenser 15 onto the cloth 17. By covering the semiconductor integrated circuit chip 1 with the cloth 17, the solvent 16 is prevented from being spread to the parts around the semiconductor integrated circuit chip 1. When there are no parts around the semiconductor integrated circuit chip 1, the solvent 16 may be directly applied to the semiconductor integrated circuit chip 1 without using the cloth 17. Preferable examples of the solvent 16 are N,N-dimethyl formamide (DMF), 1-methyl-2-pyrrolidone (NMP), dimethyl sulfoxide (DMSO), dioxane, butyl acetate, raffinate, isopropyl alcohol, and the like (step A7).

In order to dissolve the soluble resin 5, the circuit board 3 is placed on a heater 22 so as to be heated. The heat temperature is set to, preferably a temperature close to the boiling point of the solvent. For example, in the case where the solvent 16 is N,N-dimethyl formamide (DMF), the heat temperature is set to 150° C. In the case of 1-methyl-2-pyrrolidone (NMP), the heat temperature is set to 180° C. In the case of dimethyl sulfoxide (DMSO), the heat temperature is 200° C. Preferable heating time is 5 minutes. The soluble resin 5 is dissolved by being heated (step A8).

The method of dissolving the soluble resin 5 is not limited to the solvent 16 but radiation, electromagnetic radiation, ultraviolet rays or the like may be also used.

After the soluble resin 5 is dissolved, the semiconductor integrated circuit chip 1 is removed.

Figure 6:
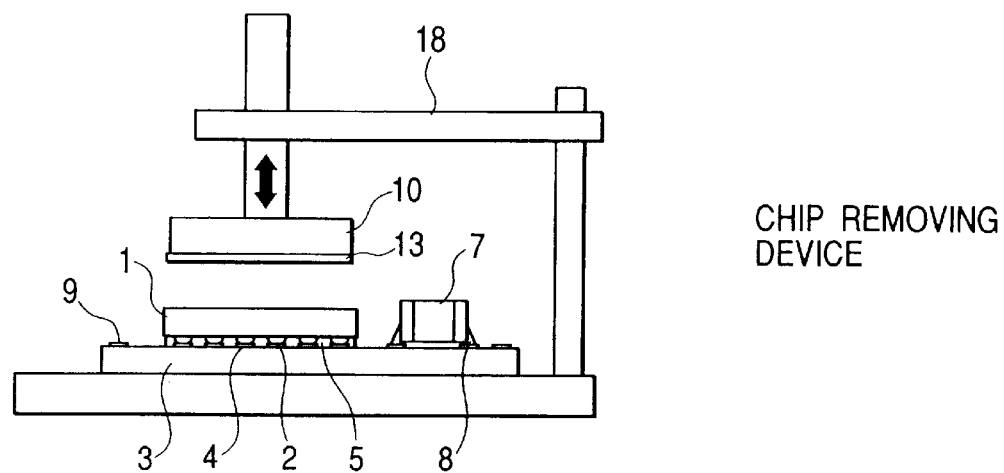
FIG. 6 is a diagram showing a chip removing device in the embodiment of the invention.
Figure 7:
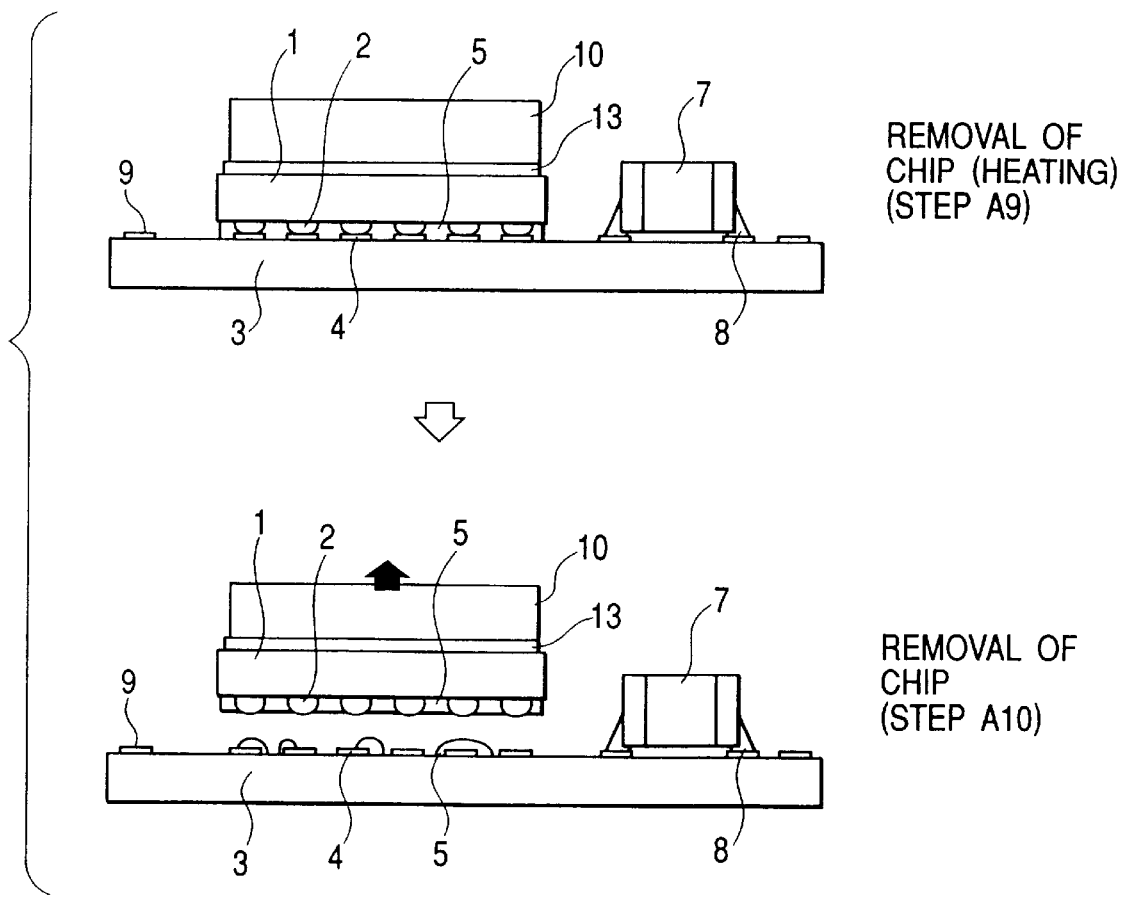
FIG. 7 is a diagram showing a chip removing process in the embodiment of the invention.

FIG. 6 shows a semiconductor integrated circuit chip removing device 18. FIG. 7 shows a method of removing the semiconductor integrated circuit chip 1.

The semiconductor integrated circuit chip removing device 18 has a structure similar to that of an ordinary bonding device as shown in FIG. 6. The structure is obtained by attaching an adhesive 13 onto the under side of the bonding tool 10. The adhesive 13 is, preferably, a double-faced tape or a thermosetting film.

First, the bonding tool 10 on which the adhesive 13 is attached is pressed against the semiconductor integrated circuit chip 1 so as to be in contact with the semiconductor integrated circuit chip 1. By using a member whose adhesion is enhanced when heat is applied to the adhesive 13, such as a thermosetting film, the adhesive 13 is heated by the bonding tool 10 (step A9).

By heating the bonding tool 10, the contact force with the semiconductor integrated circuit chip 1 of the adhesive 13 is enhanced. Consequently, when the bonding tool 10 is lifted up, the semiconductor integrated circuit chip 1 is peeled off from the circuit board 3 (step A10).

Figure 8:
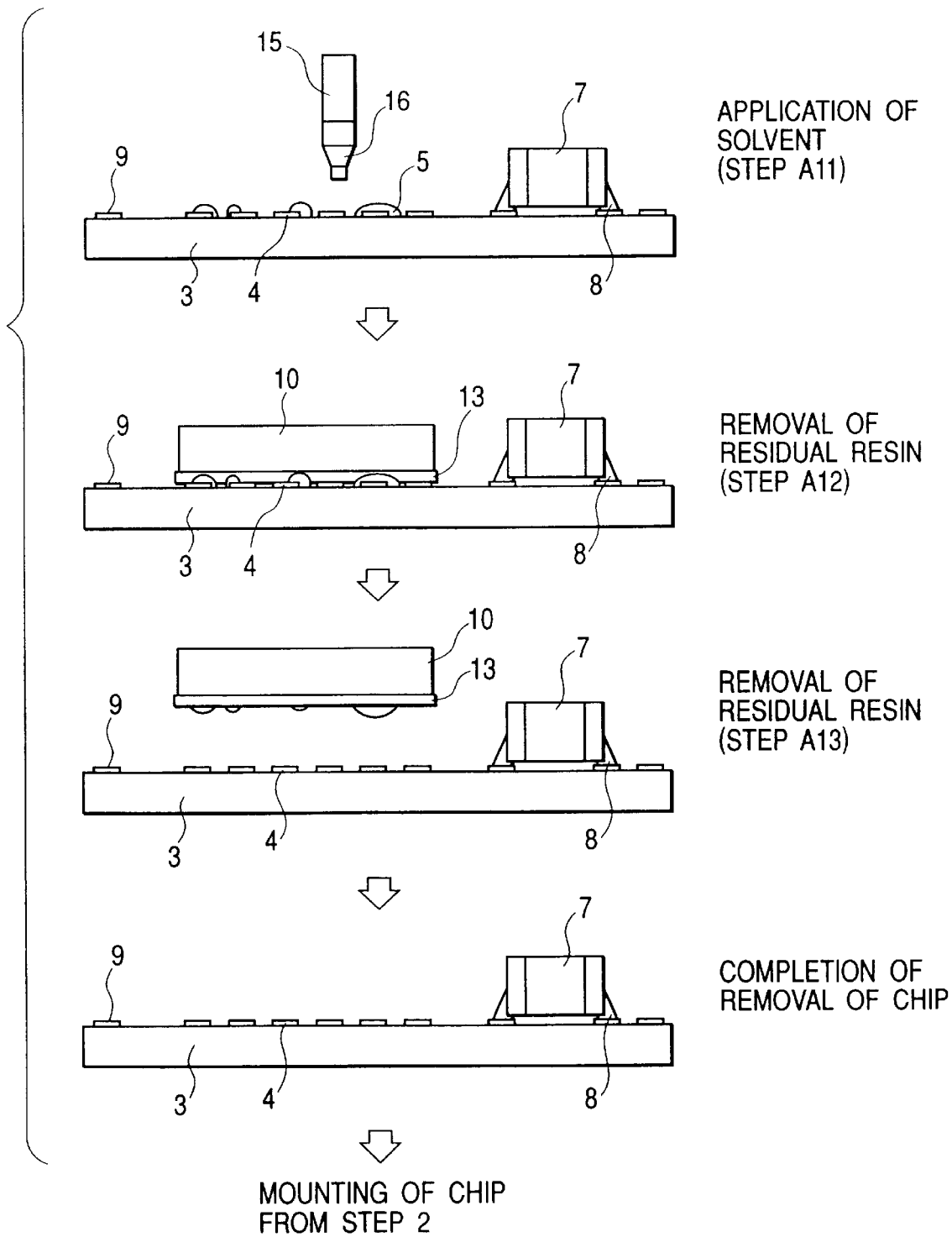
FIG. 8 is a drawing showing a residual resin removing process in the embodiment of the invention.

After removing the semiconductor integrated circuit chip 10, if the soluble resin 5 remains on the circuit board 3, the soluble resin 5 has to be removed. FIG. 8 shows a method of removing the soluble resin 5.

The solvent 16 is applied to a position where the soluble resin 5 remains on the circuit board 3 to thereby dissolve the soluble resin 5 (step A11).

The bonding tool 10 with the adhesive 13 is pressed against the residual soluble resin 5 on the circuit board 3 (step A12)

By pressing the bonding tool 10 with the adhesive 13 against the soluble resin 5 on the circuit board 3, the soluble resin 5 is transferred to the adhesive 13, thereby removing the soluble resin 5 from the circuit board 3 (step A13).

The residual soluble resin 5 may be also rubbed away with a brush or the like.

After removing the semiconductor integrated circuit chip 1 by the method shown in FIGS. 5, 7 and 8, the semiconductor integrated circuit chip 1 is again mounted by the method of step 2 shown in FIG. 3.

Figure 9:
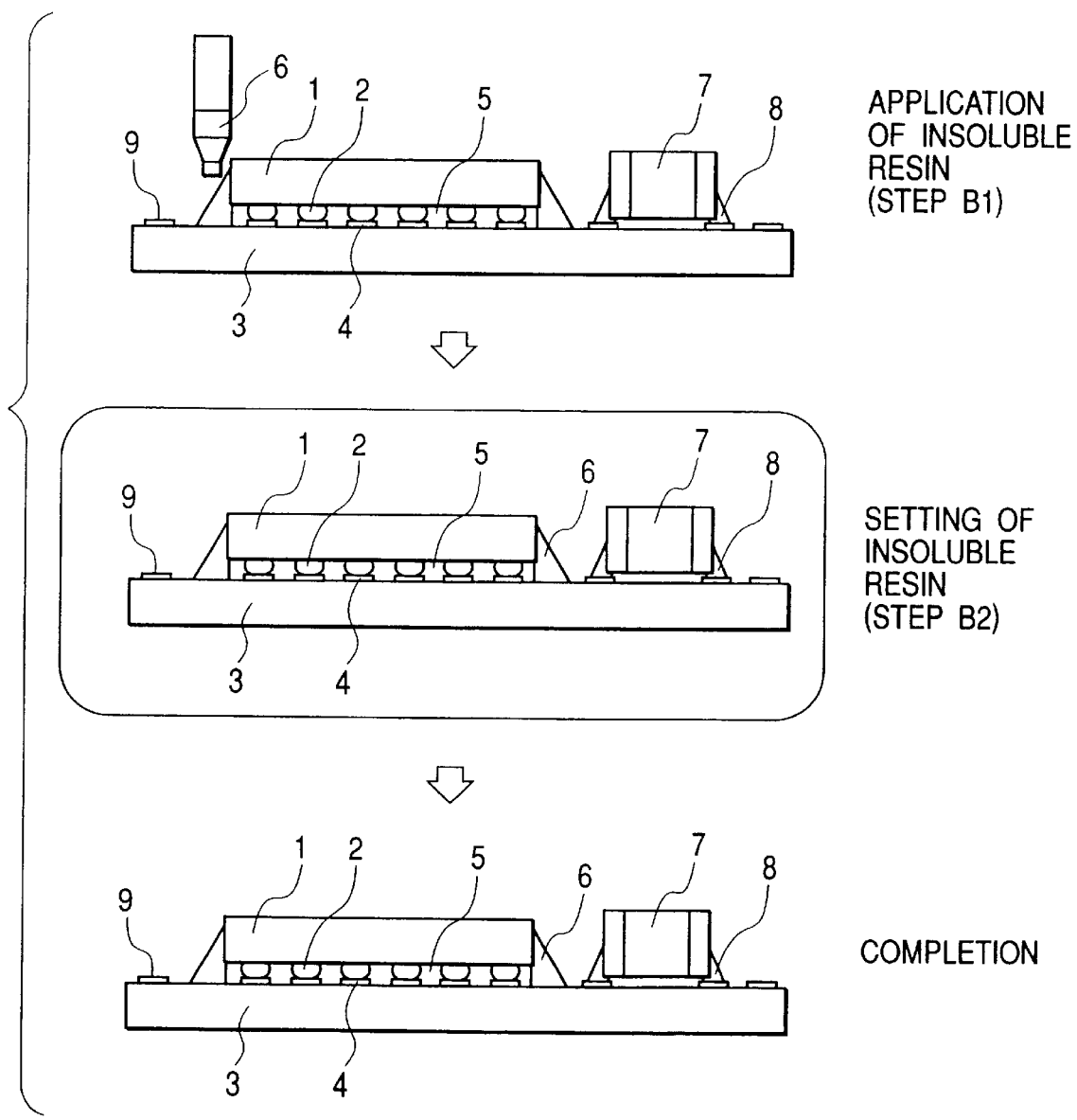
FIG. 9 is a diagram showing a resin filling process in the embodiment of the invention.

When the semiconductor integrated circuit chip 1 or the part mounted on the circuit board 3 passes the test, in order to increase the reliability, a process of applying and setting the insoluble resin 6 around the semiconductor integrated circuit chip 1 shown in FIG. 9 is performed.

First, the insoluble resin 6 is applied around the semiconductor integrated circuit chip 1 (step B1).

Then, the insoluble resin 6 is heated and set, thereby forming a resin fillet around the semiconductor integrated circuit chip 1 (step B2).

Figure 14:
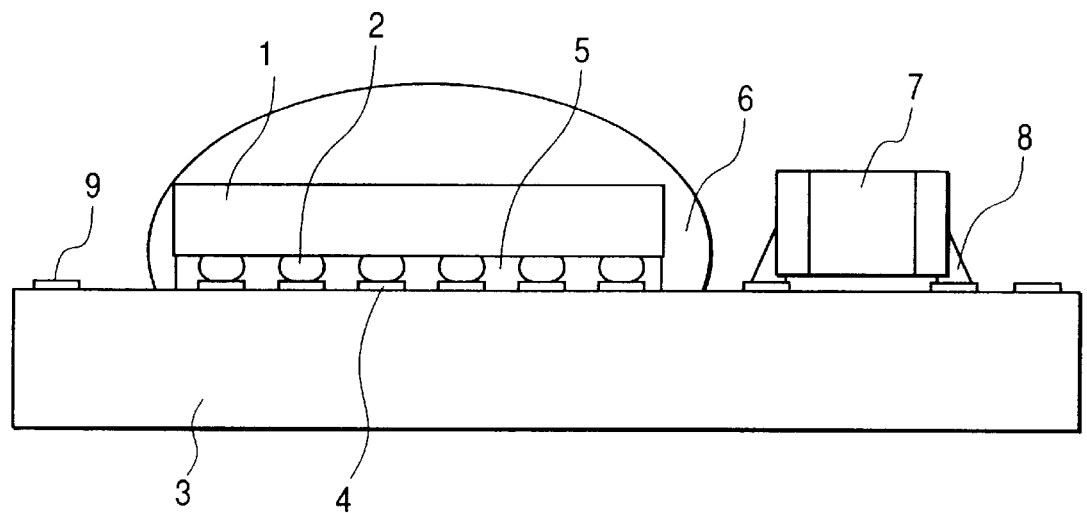
FIG. 14 is a cross section of a bonding structure in an embodiment of the invention.

A structure as shown in FIG. 14 may be also used, in which the semiconductor integrated circuit chip 1 is covered with the insoluble resin 6 by applying the insoluble resin 6 onto the semiconductor integrated circuit chip 1 from right above and setting the insoluble resin 6.

By performing the above processes, the flip-chip bonding structure as shown in FIGS. 1 and 14 can be manufactured.

The flip-chip bonding structure of the present invention uses the soluble member to bond the semiconductor integrated circuit chip 1 and the circuit board 3. It is therefore easy to remove the semiconductor integrated circuit chip 1. Further, since the insoluble resin 6 is applied around the semiconductor integrated circuit chip, the structure is resistant to the solvent. Thus, the method can realize the flip-chip bonding of the semiconductor integrated circuit chip 1 having high bonding reliability.

Figure 11:
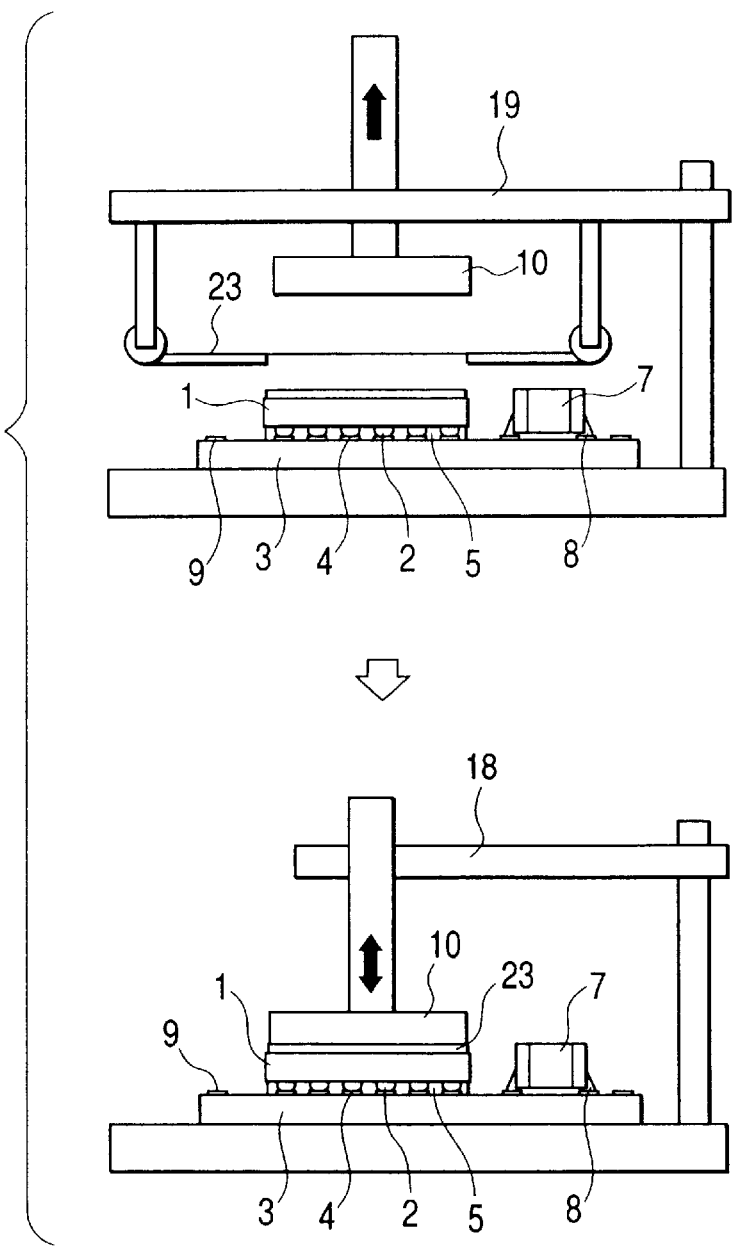
FIG. 11 is a diagram showing a chip removing process in the embodiment of the invention.
Figure 12:
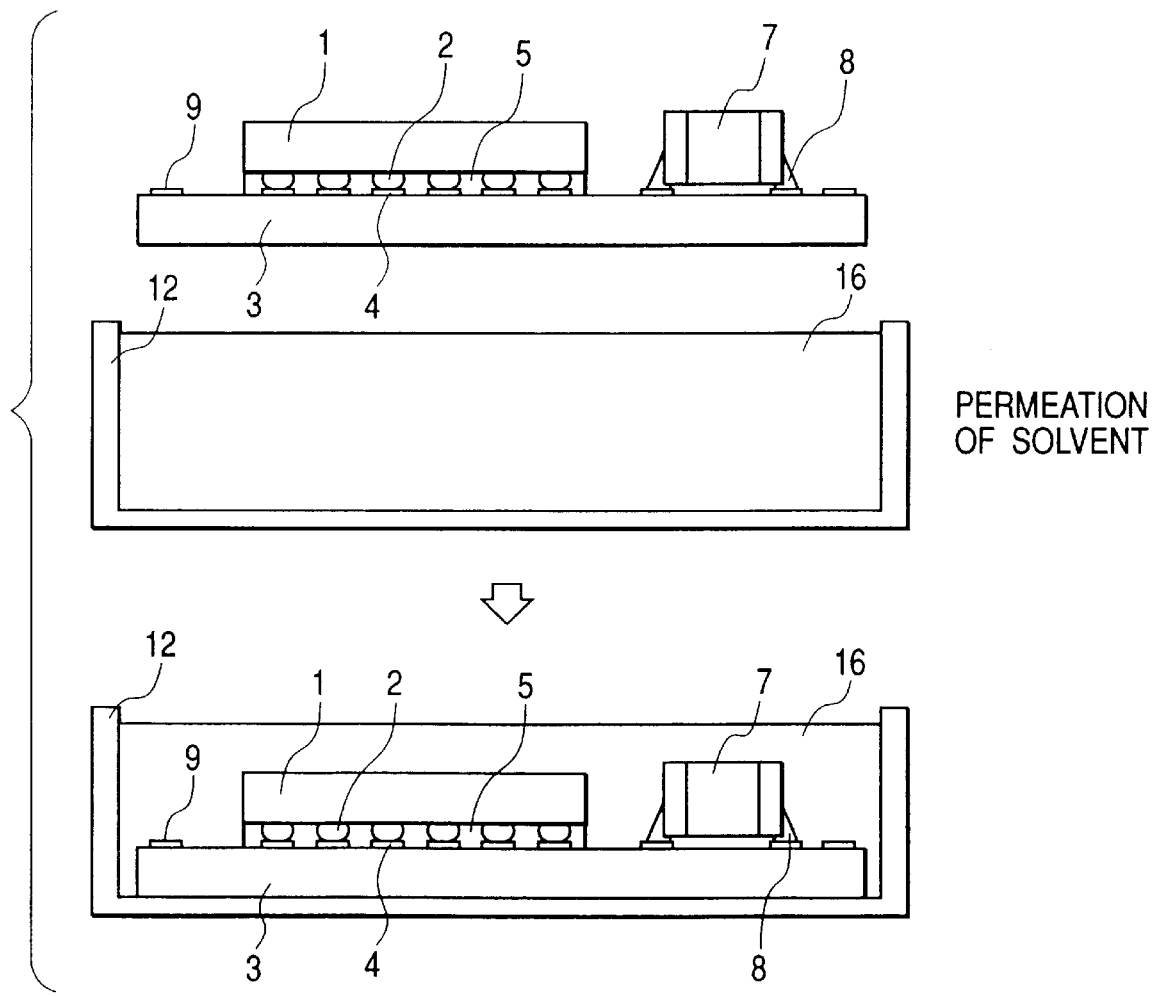
FIG. 12 is a diagram showing a solvent permeating process in the embodiment of the invention.
Figure 13:
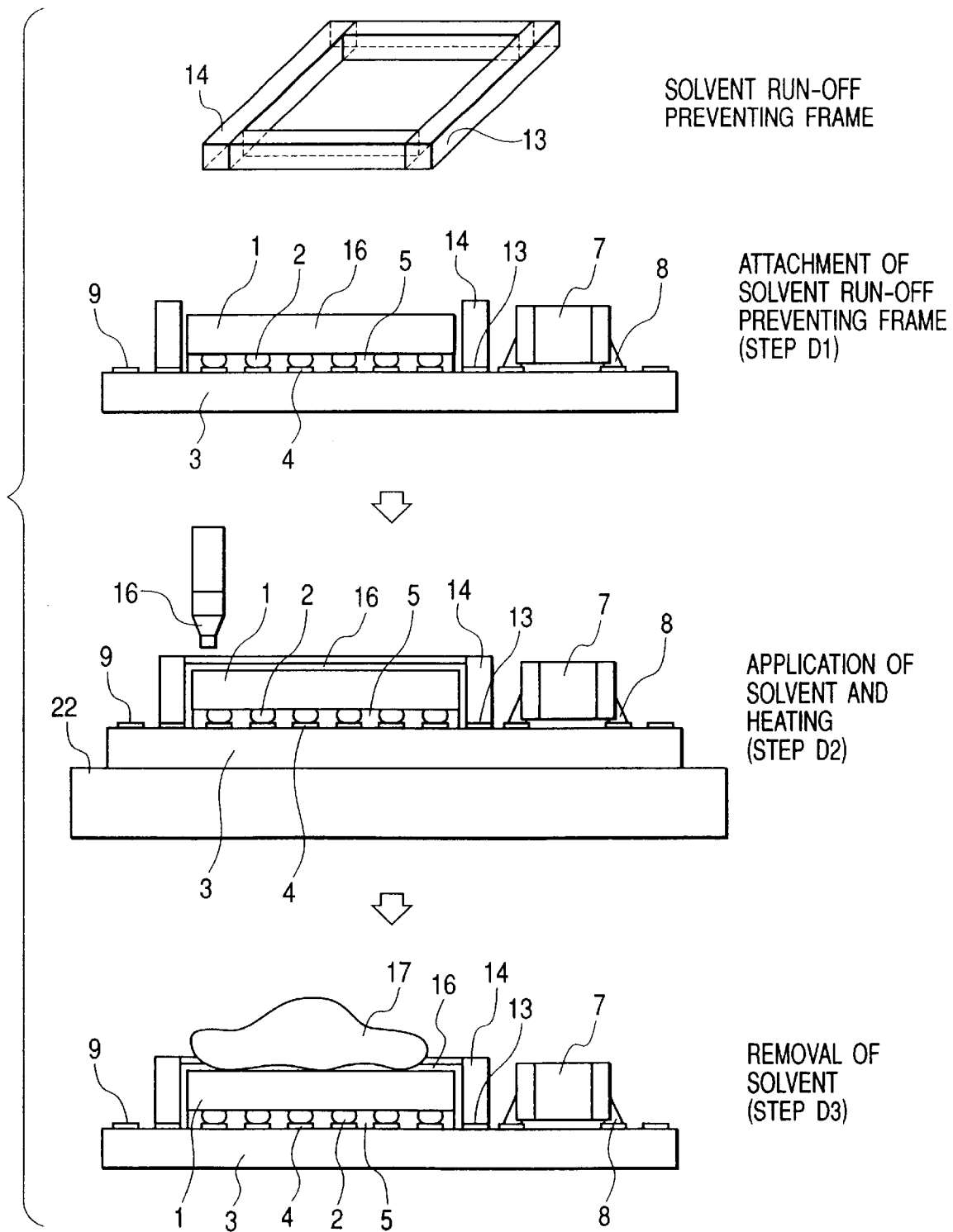
FIG. 13 is a diagram showing a solvent permeating process in the embodiment of the invention.

As other methods, there are a method of removing the semiconductor integrated circuit chip 1 (FIGS. 10 and 11) and a method of dipping the semiconductor integrated circuit chip 1 in the solvent 16 (FIGS. 12 and 13).

Figure 10:
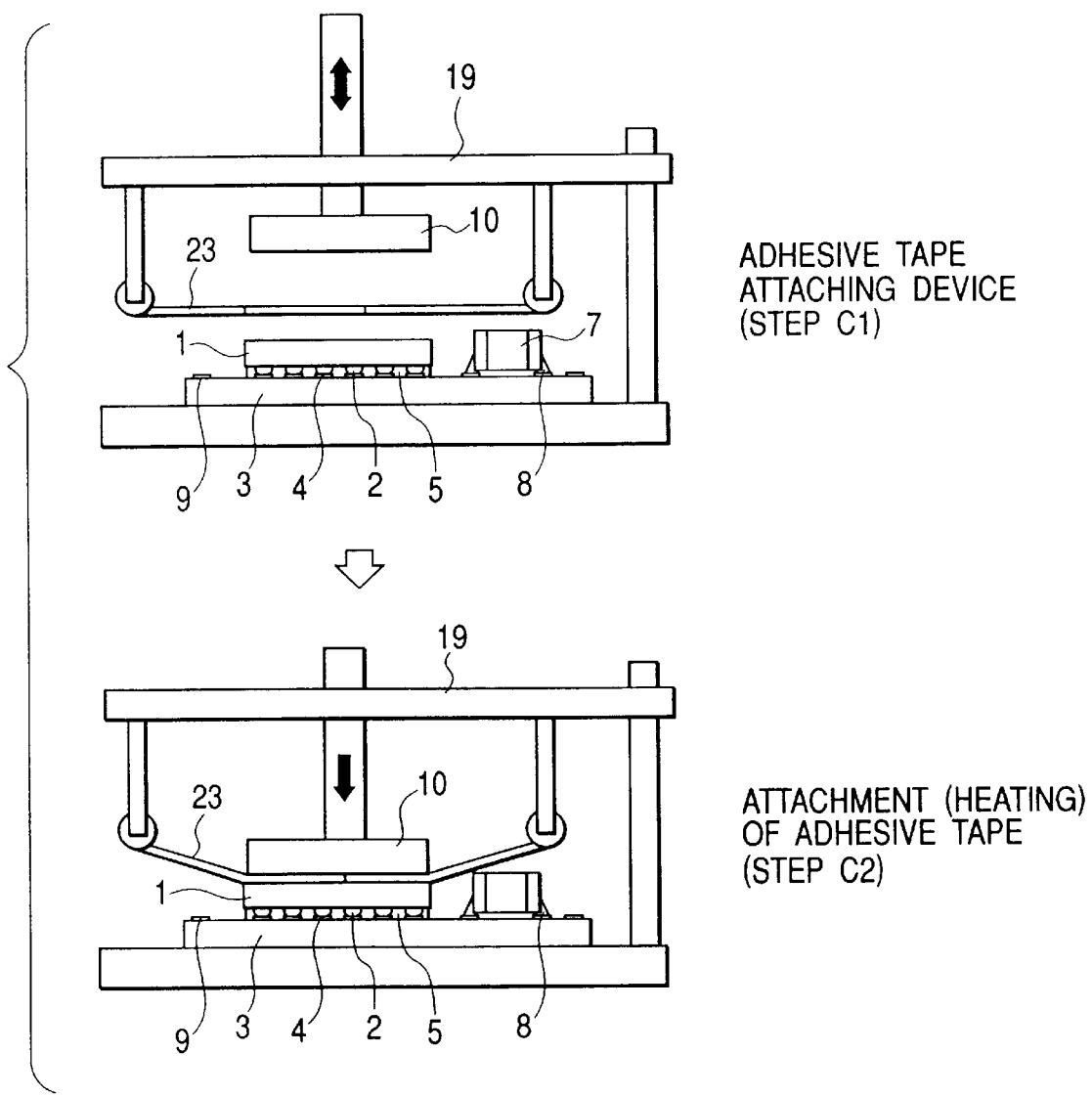
FIG. 10 is a diagram showing a chip removing process in the embodiment of the invention.

The method of removing the semiconductor integrated circuit chip 1 shown in FIGS. 10 and 11 relates to a method in which the adhesive 13 is not directly attached to the bonding tool 10. As shown in FIG. 10, an adhesive tape 23 is disposed between the semiconductor integrated circuit chip 1 and the bonding tool 10 (step C1).

The adhesive tape 23 is pressed against the semiconductor integrated circuit chip 1 by the bonding tool 10. It is preferable to make the adhesive tape 23 of a material whose adhesion is increased when heat is applied, for example, a thermosetting film (step C2).

When the bonding tool 10 is lifted, the adhesive tape 23 is transferred onto the semiconductor integrated circuit chip 1 (step C3).

When the semiconductor integrated circuit chip 1 is pressed against the adhesive tape 23 on the semiconductor 10 by the bonding tool 10, the adhesive tape 23 is bonded with the bonding tool 10. Consequently, when the bonding tool 10 is lifted, the semiconductor integrated circuit chip 1 is removed from the circuit board 3 by the adhesive tape 23 (step C4).

FIGS. 12 and 13 show methods of dipping the semiconductor integrated circuit chip 1 in the solvent 16.

As shown in FIG. 12, the solvent 16 is charged in a pan 12 and the circuit board 3 on which the semiconductor integrated circuit chip 1 is mounted is put in the pan 12. Then the solvent 16 is heated at a temperature lower than the boiling point by 10° C. The solvent 16 is, preferably, a solvent in which the circuit board 3 is not easily dissolved, for example, an alcoholic solvent such as raffinate or isopropyl alcohol.

In the case of using the solvent 16 which may dissolve the other soldered parts 7 and the circuit board 3, the method shown in FIG. 13 is used. As shown in FIG. 13, a solvent run-off preventing frame 14 is disposed around the semiconductor integrated circuit chip 1. The solvent run-off preventing frame 14 is made of a metal, especially aluminum, as a material which is not dissolved in the solvent 16. The adhesive 13 is adhered on the under face of the solvent run-off preventing frame 14 (step D1).

Then the solvent run-off preventing frame 14 is adhered onto the circuit board 3 around the semiconductor integrated circuit chip 1, the solvent 16 is applied on the semiconductor integrated circuit chip 1, and the semiconductor integrated circuit chip 1 is heated by a hot plate 22. It is preferable to set the heating temperature to a temperature lower than the boiling point of the solvent 16 by 10° C. The heating time may be about 5 minutes. For example, when an acrylic resin is used as the soluble resin 5 interposed between the circuit board 3 and the semiconductor integrated circuit chip 1 and DMF, NMP or DMSO is used as the solvent 16, preferably, DMF is heated at 150° C. for 5 minutes, NMP is heated at 180° C. for 5 minutes, and DMSO is heated at 200° C. for 5 minutes (step D2).

The semiconductor integrated circuit chip 1 is covered with the cloth 17, so that the cloth 17 is impregnated with the solvent 16 to remove the solvent 16. The solvent 16 may be flowed out by turning the circuit board 3 upside down (step D3).

The solvent run-off preventing frame 14 is taken out, the semiconductor integrated circuit chip 1 is detached as shown in FIGS. 6, 7 and 8, and the soluble resin 5 is removed.

The method shown in FIGS. 12 and 13 of applying the solvent 16 onto the semiconductor integrated circuit chip 1 may be also used.

Figure 16:
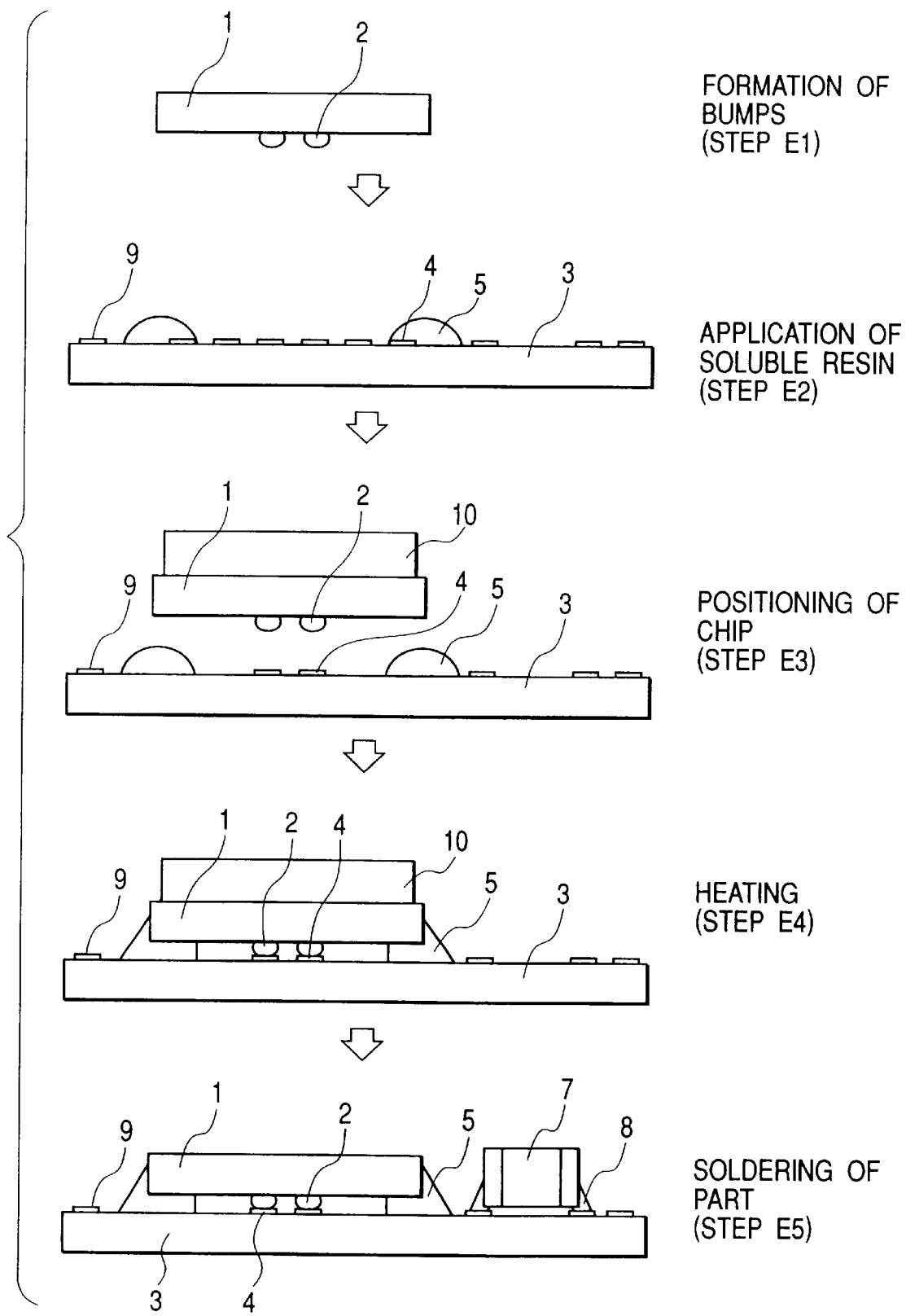
FIG. 16 is a diagram showing a chip mounting process in the embodiment of the invention.
Figure 17:
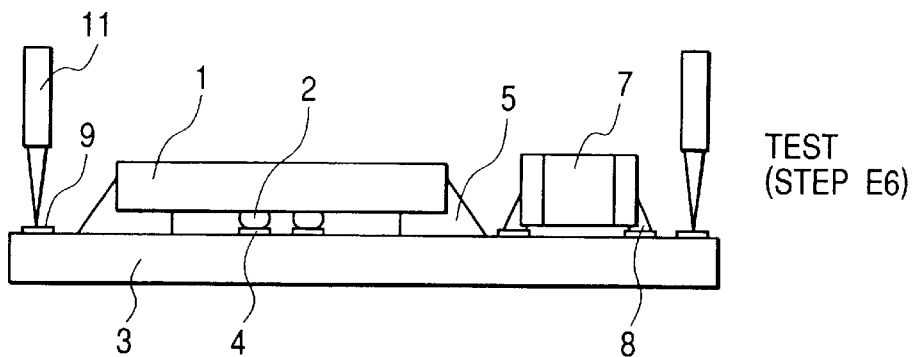
FIG. 17 is a diagram showing a chip mounting process in the embodiment of the invention.

For the semiconductor integrated circuit chip 1 such as a memory chip in which the projected electrodes 2 are formed in the center portion, the method shown in FIGS. 16 and 17 may be used.

As a pre-process of mounting the semiconductor integrated circuit chip 1 onto the circuit board 3, the projected electrodes 2 are formed in the center portion of the semiconductor integrated circuit chip 1 (step E1).

The soluble resin 5 is preliminarily applied to two sides of a position where the periphery of the semiconductor integrated circuit chip 1 is mounted on the circuit board 3 (step E2).

Subsequently, the semiconductor integrated circuit chip 1 is attracted by the bonding tool 10 and the substrate electrodes 4 on the circuit board 3 and the projected electrodes 2 on the semiconductor integrated circuit chip 1 are positioned so as to be directly bonded with the active device face of the semiconductor integrated circuit chip 1 facing downward to the circuit board 3 (step E3).

The semiconductor integrated circuit chip 1 is mounted on the circuit board 3, and the semiconductor integrated circuit chip 1 is heated by the bonding tool 10 attracting the semiconductor integrated circuit chip 1 to thereby set the soluble resin 5. When the soluble resin 5 is a thermoset resin, heat is applied. When the soluble resin 5 is a photo-setting resin, light is applied (step E4).

The part 7 to be soldered necessary for the operation check of the semiconductor integrated circuit chip 1 is mounted (step E5).

After the semiconductor integrated circuit chip 1 and the part 7 to be soldered are mounted, the semiconductor integrated circuit chip 1 or the part mounted on the circuit board 3 is tested. The test is conducted by, for example, making the probe 11 contact with the electrode 9 for test on the circuit board 3 and examining an output characteristic of the semiconductor integrated circuit chip 1 (step E6).

When the result of the test is that the semiconductor integrated circuit chip 1 is faulty, the semiconductor integrated circuit chip 1 is removed from the circuit board 3 by the methods of FIGS. 5, 7 and 8.

Figure 18:
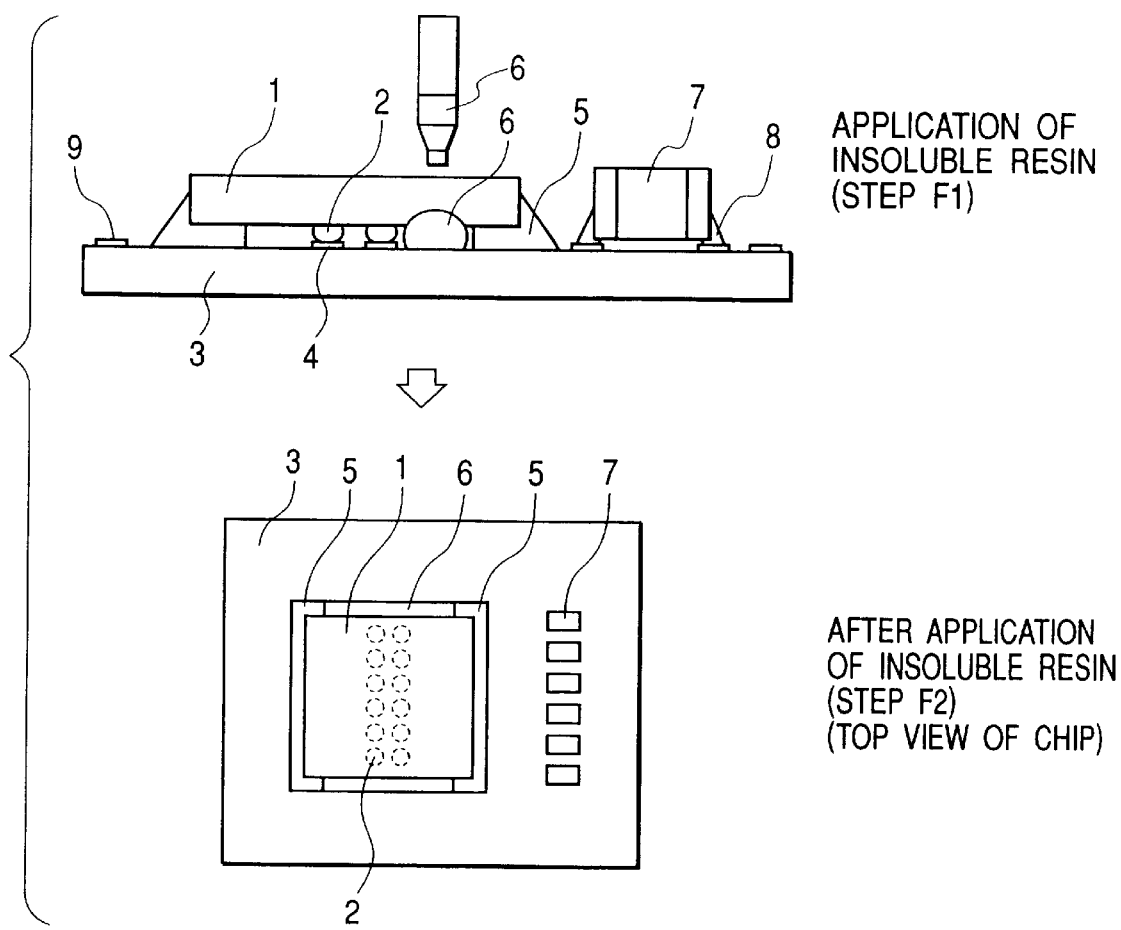
FIG. 18 is a diagram showing a resin filling process in the embodiment of the invention.
Figure 19:
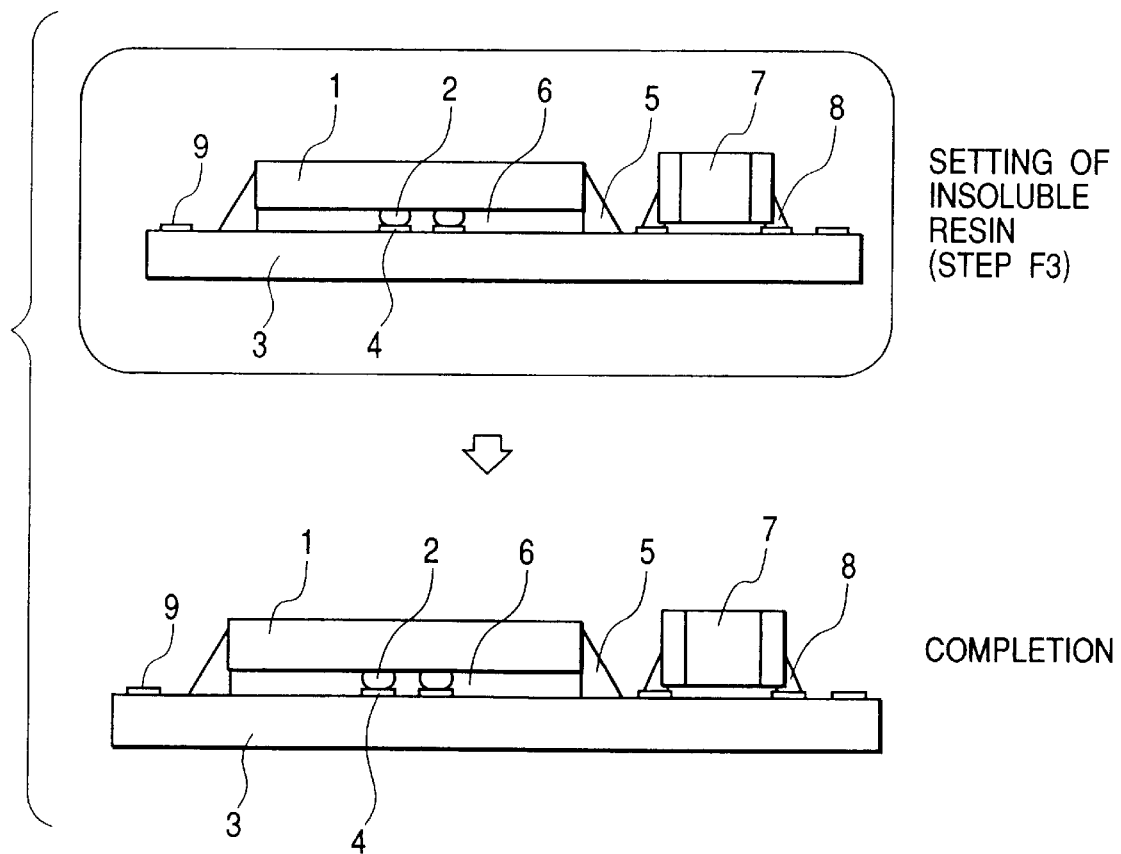
FIG. 19 is a diagram showing a resin filling process in the embodiment of the invention.

When the semiconductor integrated circuit chip 1 passes the test, the processes shown in FIGS. 18 and 19 are performed.

First, the insoluble resin 6 is applied to one side of the semiconductor integrated circuit chip 1, which is not bonded by the soluble resin 5 (step F1).

Then the circuit board 3 is heated at a temperature at which the viscosity of the insoluble resin 6 becomes low, and the insoluble resin 6 is poured into a gap between the semiconductor integrated circuit chip 1 and the circuit board 3 (step F2).

The insoluble resin 6 is set by heating, thereby bonding the semiconductor integrated circuit chip 1 and the circuit board 3 with the soluble resin 5 and the insoluble resin 6 (step F3).

Figure 15:
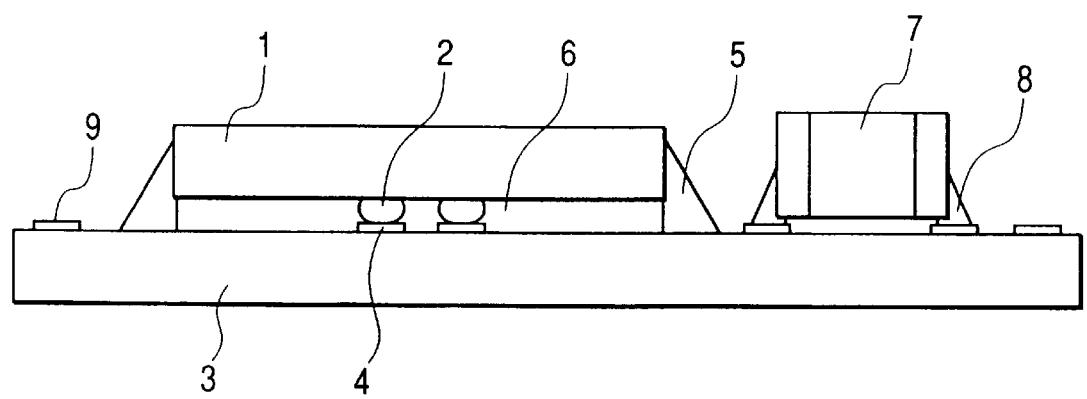
FIG. 15 is a cross section of a bonding structure in an embodiment of the invention.

By performing the processes, the flip-chip bonding structure as shown in FIG. 15 can be manufactured.

Although the mounting of the semiconductor integrated circuit chip has been mainly described, obviously, the invention is not limited to the semiconductor integrated circuit chip but can be applied to other electronic parts to be mounted on the circuit board.

In place of the soluble resin for bonding the semiconductor integrated circuit chip and the circuit board, insoluble resins having a relation such that adhesion on an adhesion interface of a resin bonding the circuit board and the electronic part becomes stronger than that of a resin applied around the electronic part by a solvent may be used. In this case, it is preferable to use a resin having the adhesion of 10 to 50 MPa with the circuit board or the semiconductor integrated circuit chip. With such an adhesion, it is sufficient to assure the electric connection at the time of operation. By using a solvent, the adhesion with the circuit board or the semiconductor integrated circuit chip is lowered by one digit to 1 to 5 MPa. Consequently, the adhesion can be set to an interface adhesion of a degree such that the semiconductor integrated circuit chip can be removed.

The resin to be applied around the semiconductor integrated circuit is not limited to the insoluble resin but may be a moisture-proof soluble resin or a soluble resin of high thermal conductivity for heat dissipation. In any of the cases, in order to assure the adhesion (reliability) at the time of operation, the adhesion of at least 10 MPa is necessary. The projected electrodes on the semiconductor integrated circuit chip may be made of a solder or Au. A thermoplastic or thermosetting conductive resin may be further formed on the projected electrodes, or a solder may be also provided on the electrodes of the circuit board. A structure obtained by combining the above may be also used. In the case of using solder, it is preferable to fuse the solder after an operation check in consideration of a repair.

According to the invention, the semiconductor integrated circuit chip can be easily removed and the reliability of the flip-chip bonding can be assured. An apparatus and method of detaching electronic parts, which enables electronic parts to be detached can be also realized.

We claim:

1. A method of packaging an electronic part, comprising the steps of:
   a step of bonding an electronic part and a circuit board with a soluble resin;
   a step of conducting an operation check of the electronic part;
   a step of detaching the electronic part from said circuit board by weakening adhesion of said soluble resin by using a solvent when the electronic part fails the operation check; and
   a step of bonding the electronic part by applying an insoluble resin around the electronic part when the electronic part passes the operation check.

2. A method of packaging an electronic part according to claim 1, wherein the electronic part is detached by using an adhesive member.

3. A method of packaging an electronic part according to claim 1 or 2, wherein an insoluble resin whose adhesion on an adhesion interface can be weakened by a solvent is used in place of the soluble resin.

4. A packaging structure comprising:
   a circuit board on which an electric circuit pattern is formed;
   an electronic part which is electrically connected to an electrode on said circuit board;
   a soluble resin for bonding said circuit board and said electronic part; and
   an insoluble resin applied around said electronic part.

5. A packaging structure comprising:
   a circuit board on which an electric circuit pattern is formed;
   an electronic part which is electrically connected to an electrode on said circuit board;
   a first soluble resin for bonding said circuit board and said electronic part; and
   a second soluble resin applied around said electronic part; and
   wherein said second soluble resin has adhesion of at least 10 MPa and is made of moisture-proof soluble resin or high thermal conductivity soluble resin.

6. A packaging structure comprising:
   a circuit board on which an electric circuit pattern is formed;
   a semiconductor integrated circuit chip which is electrically connected to an electrode on said circuit board;
   a soluble resin for bonding said circuit board and said semiconductor integrated circuit chip;
   an insoluble resin applied around said semiconductor integrated circuit chip; and
   wherein said soluble resin is acrylic resin, cyano acrylate, polyethylene, polypropylene, or ABS, and said insoluble resin is epoxy resin, phenolic resin, or melamine resin.

* * * * *